(12) United States Patent
Hsu et al.

(10) Patent No.: US 11,069,409 B2
(45) Date of Patent: Jul. 20, 2021

(54) METHOD, ASSOCIATED MEMORY DEVICE AND CONTROLLER THEREOF FOR PERFORMING PROGRAMMING MANAGEMENT

(71) Applicant: Silicon Motion Inc., Hsinchu County (TW)

(72) Inventors: Che-Wei Hsu, Taichung (TW); Hsin-Hsiang Tseng, Hsinchu (TW)

(73) Assignee: Silicon Motion, Inc., Hsinchu County (TW)

( * ) Notice: Subject to any disclaimer, the term of this patent is extended or adjusted under 35 U.S.C. 154(b) by 108 days.

(21) Appl. No.: 15/859,709

(22) Filed: Jan. 1, 2018

(65) Prior Publication Data

US 2019/0027221 A1 Jan. 24, 2019

(30) Foreign Application Priority Data

Jul. 21, 2017 (TW) .................................. 106124457

(51) Int. Cl.
*G11C 16/10* (2006.01)
*G11C 11/56* (2006.01)
*G06F 3/06* (2006.01)
*G06F 12/02* (2006.01)
*G11C 16/04* (2006.01)
*G06F 1/32* (2019.01)

(52) U.S. Cl.
CPC ............... *G11C 16/10* (2013.01); *G06F 1/32* (2013.01); *G06F 3/0625* (2013.01); *G06F 3/0659* (2013.01); *G06F 3/0679* (2013.01); *G06F 3/0688* (2013.01); *G06F 12/0246* (2013.01); *G11C 11/5628* (2013.01); *G11C 16/0483* (2013.01)

(58) Field of Classification Search
CPC ... G06F 12/0246; G06F 2212/72–7211; G06F 12/00–16; G06F 1/32–3296
See application file for complete search history.

(56) References Cited

U.S. PATENT DOCUMENTS

| | | | |
|---|---|---|---|
| 7,502,259 B2 | 3/2009 | Gorobets | |
| 8,441,869 B2 | 5/2013 | Kim | |
| 9,582,211 B2 | 2/2017 | Ellis | |
| 9,711,225 B2 | 7/2017 | Balakrishnan | |
| 2005/0144516 A1 | 6/2005 | Gonzalez | |

(Continued)

FOREIGN PATENT DOCUMENTS

| | | | |
|---|---|---|---|
| CN | 101142564 A | 3/2008 | |
| CN | 101930343 A | 12/2010 | |

(Continued)

*Primary Examiner* — Nicholas J Simonetti
(74) *Attorney, Agent, or Firm* — Winston Hsu (57) ABSTRACT

A method for performing programming management, associated memory device and a controller thereof are provided. The memory device may include a non-volatile (NV) memory, and the NV memory may include a plurality of NV memory elements. The method may include: before programming a target NV memory element of the plurality of NV memory elements, checking whether another NV memory element of the plurality of NV memory elements is in a busy state or in a non-busy state; and when the other NV memory element enters the non-busy state, programming the target NV memory element.

12 Claims, 7 Drawing Sheets

(56) References Cited

U.S. PATENT DOCUMENTS

| | | |
|---|---|---|
| 2008/0147968 A1 | 6/2008 | Lee |
| 2011/0004723 A1 | 1/2011 | Kheng-Chong |
| 2011/0093649 A1 | 4/2011 | Lee |
| 2011/0202780 A1* | 8/2011 | Ko .................. G06F 1/3268 713/320 |
| 2012/0239853 A1 | 9/2012 | Moshayedi |
| 2013/0007380 A1* | 1/2013 | Seekins ............ G06F 3/0616 711/154 |
| 2015/0154108 A1* | 6/2015 | Gorobets ......... G06F 12/0246 711/103 |
| 2016/0239381 A1 | 8/2016 | Nakazumi |
| 2016/0259553 A1 | 9/2016 | Buxton |

FOREIGN PATENT DOCUMENTS

| | | |
|---|---|---|
| CN | 103853666 A | 6/2014 |
| CN | 105637588 A | 6/2016 |
| CN | 106662979 A | 5/2017 |
| TW | 201133239 A1 | 10/2011 |
| TW | 201715400 A | 5/2017 |

* cited by examiner

METHOD, ASSOCIATED MEMORY DEVICE AND CONTROLLER THEREOF FOR PERFORMING PROGRAMMING MANAGEMENT

BACKGROUND OF THE INVENTION

1. Field of the Invention

The present invention relates to flash memory access, and more particularly, to a method, associated apparatus and controller for performing programming management in a memory device.

2. Description of the Prior Art

Developments in memory technology have enabled the wide application of portable memory devices, such as memory cards conforming to SD/MMC, CF, MS and XD specifications. Improving access control of memories in these portable memory devices remains an issue to be solved in the art.

NAND flash memories may comprise single level cell (SLC) and multiple level cell (MLC) flash memories. In an SLC flash memory, each transistor used as a memory cell may have either of two electrical charge values: logic values 0 and 1. In comparison, the storage ability of each transistor used as a memory cell in an MLC flash memory may be fully utilized. The transistor in the MLC flash memory can be driven by a voltage higher than that in the SLC flash memory, and different voltage levels can be utilized to record information of at least two bits (e.g. 00, 01, 11, or 10). In theory, the recording density of the MLC flash memory may reach at least twice the recording density of the SLC flash memory, and is therefore preferred by manufacturers of NAND flash memories.

The lower cost and larger capacity of the MLC flash memory means it is more likely to be applied in portable memory devices than an SLC flash memory. The MLC flash memory does have instability issues, however. To ensure that access control of the flash memory in the portable memory device meets required specifications, a controller of the flash memory is configured to apply management mechanisms for properly managing data access.

Even memory devices with the above management mechanism will have certain deficiencies, however. For example, the instantaneous power consumption of a memory device in response to some types of write/program operations may be too large, potentially exceeding predetermined product specification limitations. Hence, there is a need for a novel method and memory access mechanism of memory devices which can achieve optimal performance without introducing side effects or in a way that is less likely to introduce side effects.

SUMMARY OF THE INVENTION

One objective of the present invention is to provide a method, associated apparatus and controller for performing dynamic resource management in a memory device, in order to solve the above-mentioned problem.

Another objective of the present invention is to provide a method, an associated apparatus and a controller thereof for performing dynamic resource management in a memory device, in order to achieve optimal performance without introducing side effects or in a way that is less likely to introduce side effects.

At least one embodiment of the present invention provides a method for performing programming management in a memory device. The memory device comprises a non-volatile (NV) memory, and the NV memory comprises a plurality of NV memory elements. The method comprises: before programming a target NV memory element of the plurality of NV memory elements, checking whether another NV memory element of the plurality of NV memory elements is in a busy state or in a non-busy state; and when the other NV memory element enters the non-busy state, programming the target NV memory element.

At least one embodiment of the present invention provides a memory device which comprises a NV memory and a controller. The NV memory is arranged to store information, wherein the NV memory comprises a plurality of NV memory elements. The controller is coupled to the NV memory, and is arranged to control operations of the memory device. The controller comprises a processing circuit which is arranged to control the controller according to a command from a host device, to allow the host device to access the NV memory via the controller. Before programming a target NV memory element of the plurality of NV memory elements, the controller checks whether another NV memory element of the plurality of NV memory elements is in a busy state or in a non-busy state. When the other NV memory element enters the non-busy state, the controller programs the target NV memory element.

At least one embodiment of the present invention provides a controller of a memory device. The memory device comprises the controller and a non-volatile (NV) memory, and the NV memory comprises a plurality of NV memory elements. The controller comprises a processing circuit which is arranged to control the controller according to a command from a host device, to allow the host device to access the NV memory via the controller. Before programming a target NV memory element of the plurality of NV memory elements, the controller checks whether another NV memory element of the plurality of NV memory elements is in a busy state or in a non-busy state. When the other NV memory element enters the non-busy state, the controller programs the target NV memory element.

By properly performing programming management, the present invention can properly control the operation of the controller and prevent instantaneous power consumption or the memory device exceeding predetermined product specification limitations. In addition, implementing according to the embodiments of the present invention will not greatly increase additional costs, and may even be more cost-effective than related art techniques. Problems existing in the related arts can be solved without greatly increasing the overall cost. The present invention may achieve optimal performance without introducing side effects or in a way that is less likely to introduce side effects.

These and other objectives of the present invention will no doubt become obvious to those of ordinary skill in the art after reading the following detailed description of the preferred embodiment that is illustrated in the various figures and drawings.

DETAILED DESCRIPTION

I. Memory System

Figure 1:
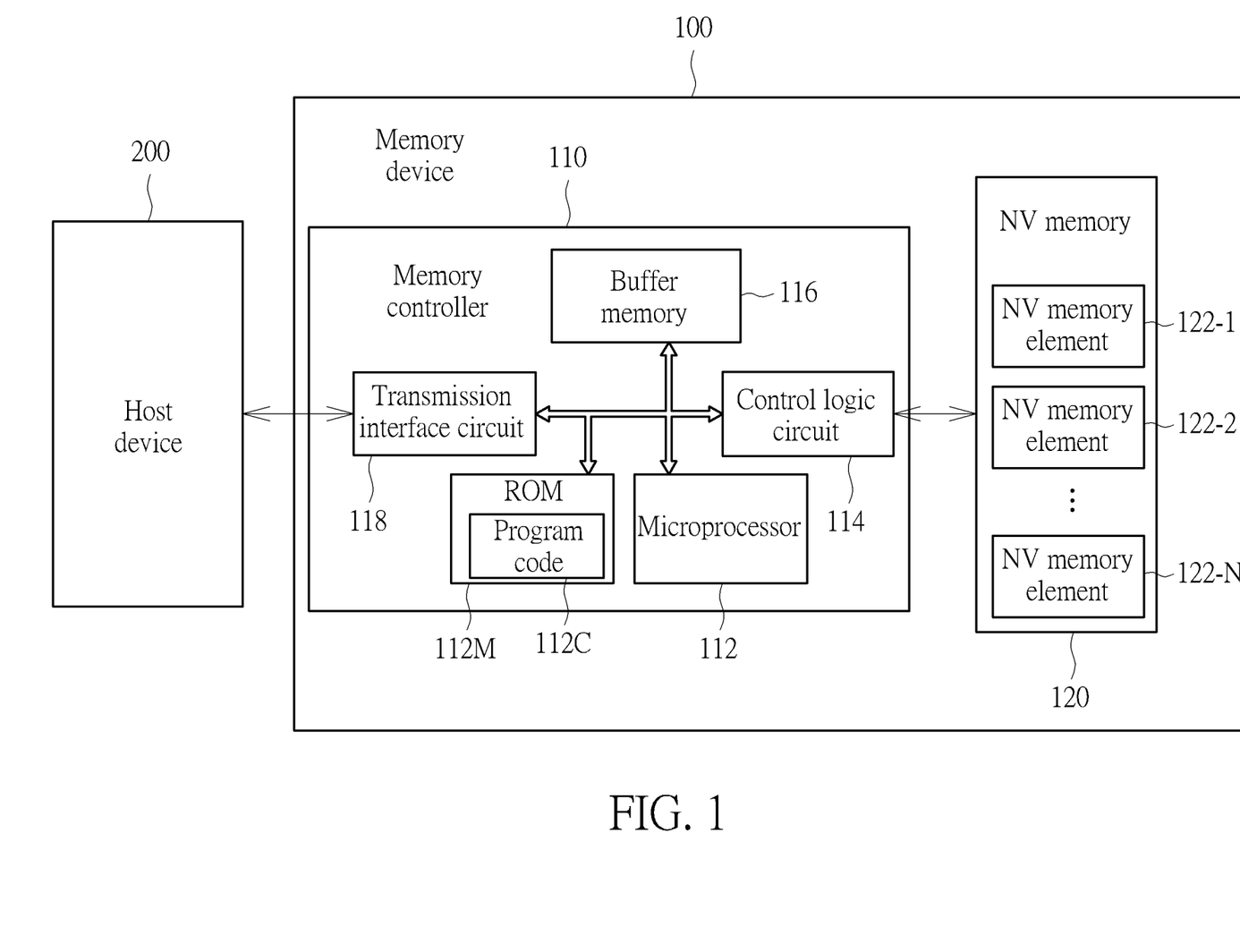
FIG. 1 is a diagram illustrating a memory device and a host device according to a first embodiment of the present invention.

Refer to FIG. 1, which is a diagram illustrating a memory device 100 and a host device 200 according to a first embodiment of the present invention. The memory device 100 may be a portable memory device (e.g. a memory card conforming to the SD/MMC, CF, MS or XD specification) or a solid state drive (SSD). In addition, examples of the host device 200 may comprise (but are not limited to): a multi-functional mobile phone, tablet, wearable device, and personal computer (e.g. a desktop computer or a laptop computer). According to this embodiment, the memory device 100 may comprise a controller such as a memory controller 110, and may further comprise a non-volatile (NV) memory 120, wherein the controller is arranged to access the NV memory 120, and the NV memory 120 is arranged to store information. The NV memory 120 may comprise a plurality of NV memory elements 122-1, 122-2, . . . , and 122-N, wherein the symbol "N" may represent an integer larger than 1. For example, the NV memory 120 may be a flash memory, and the NV memory elements 122-1, 122-2, . . . , and 122-N may be a plurality of flash memory chips (flash chips) or a plurality of flash memory dies (flash dies), but the present invention is not limited thereto.

As shown in FIG. 1, the memory controller 110 may comprise a processing circuit such as a microprocessor 112, a storage such as a read only memory (ROM) 112M, a control logic circuit 114, a buffer memory 116, and a transmission interface circuit 118, wherein these components may be coupled to one another via a bus. The buffer memory 116 is implemented with a random access memory (RAM). Further, the ROM 112M of this embodiment is arranged to store a program code 112C, and the microprocessor 112 is arranged to execute the program code 112C in order to control access of the NV memory 120. Note that the program code 112C may also be stored in the buffer memory 116 or in any type of memory. In addition, the control logic circuit 114 may comprise an error correction code (ECC) circuit (not shown) for protecting data and/or performing error correction, and the transmission interface circuit 118 may conform to a specific communications specification (e.g. the serial advanced technology attachment (SATA) specification, the universal serial bus (USB) specification, or the peripheral component interconnect express (PCIE) specification), and may perform communications according to this specific communications specification.

In this embodiment, the host device 200 may access the memory device 100 by sending commands and corresponding logical addresses to the memory controller 110. The memory controller 110 receives the commands and the logical addresses, and controls the NV memory 120 to perform reading, writing/programming, or erasing on memory units having physical addresses within the NV memory 120, wherein the physical addresses correspond to the logical addresses.

II. Page Address Linking Table

Figure 2A:
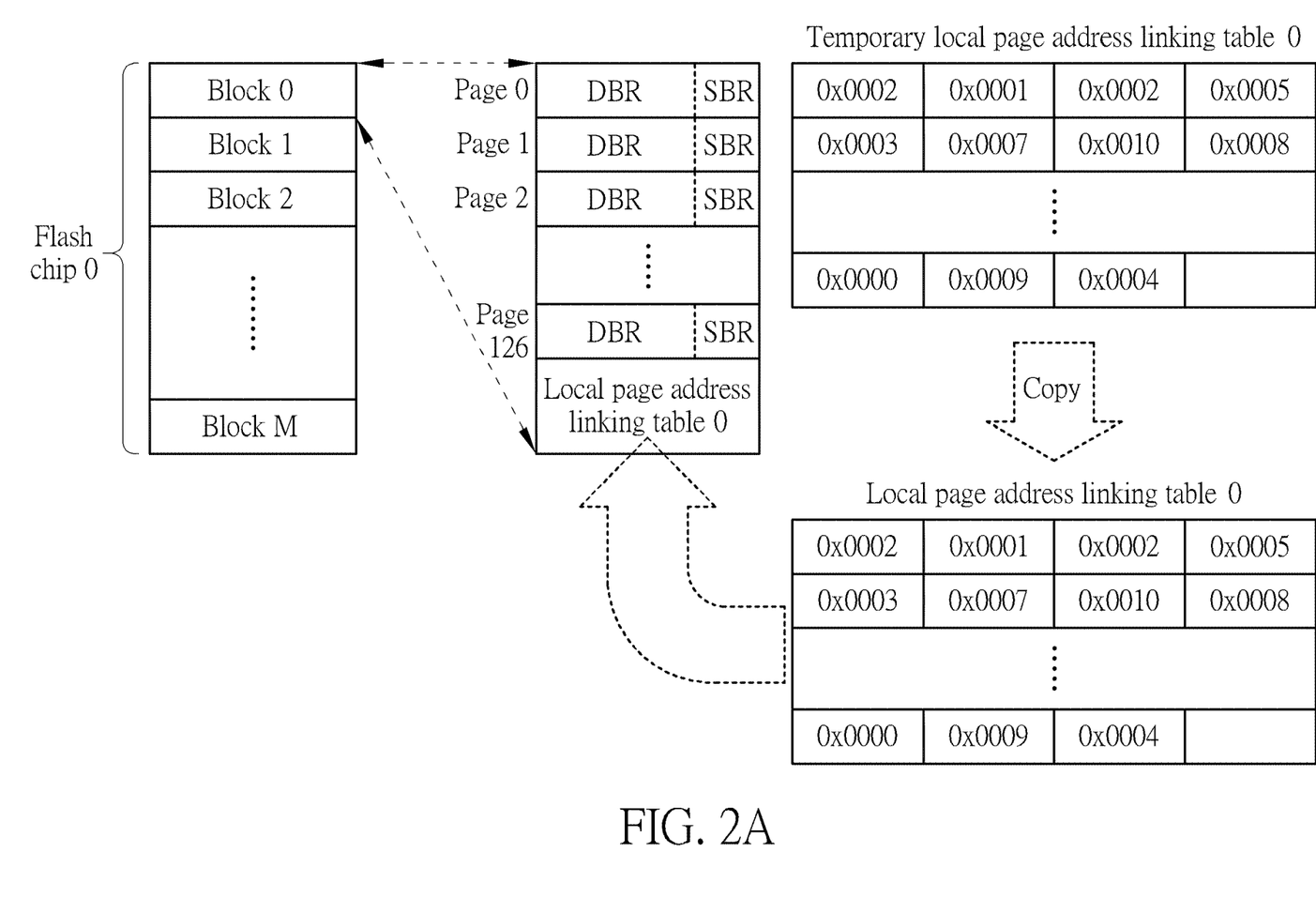
FIG. 2A illustrates a local page address linking table in a block of a flash chip.

FIG. 2A illustrates a local page address linking table in a block of a flash chip 0, wherein the flash chip 0 may be an example of the above-mentioned flash memory chip. As shown in FIG. 2A, the flash chip 0 comprises a plurality of blocks 0, 1, 2, . . . , and M. Note that a block is an erasing unit. When there is a need for erasing data, the microprocessor 112 simultaneously erases all data stored in the block. Further, a block (e.g. the block 0 shown in FIG. 2A) may comprise a plurality of pages. For example, the block 0 of the flash chip 0 comprises 128 pages. In the block (such as the block 0), these pages are divided into two areas: a data area for storing data and a table area for storing a local page address linking table 0. Pages in the data area of the block may be called data pages of the block, wherein any of the data pages may comprise a data byte region DBR and a spare byte region SBR.

According to this embodiment, the number of pages in the data area and the number of pages in the table area may be set or modified according to actual needs. For example, pages 0, 1, 2, . . . , and 126 may be arranged to store data, and the remaining page in the block may be arranged to store the local page address linking table 0. According to some embodiments, the data area may comprise less than 127 pages, and the table area may comprise two or more pages. In another example, the number of all pages in the block, the number of all pages in the data area, and the number of all pages in the table area may vary. Note that a page is a programming/writing unit. When programming/writing data, the microprocessor 112 programs/writes data having a data amount comparable to a whole page data amount into a page. According to this embodiment, each block within blocks of each flash chip in the NV memory 120 shown in FIG. 1 may comprise a local page address linking table. For brevity, FIG. 2A only depicts the local page address linking table 0 of the block 0 of the flash chip 0, as any two local page address linking tables in the NV memory 120 may have similar functions and operations.

In this embodiment, the creation time of the local page address linking table 0 is the time point when all data pages in block 0 have been written (i.e. fully programmed). Before the data pages in the block 0 are fully programmed, however, the microprocessor 112 temporarily stores a temporary local page address linking table 0 into the random access memory; and when any linking relationship between a physical page address and a logical page address in the block 0 changes, the microprocessor 112 updates the temporary local page address linking table 0.

Figure 2B:
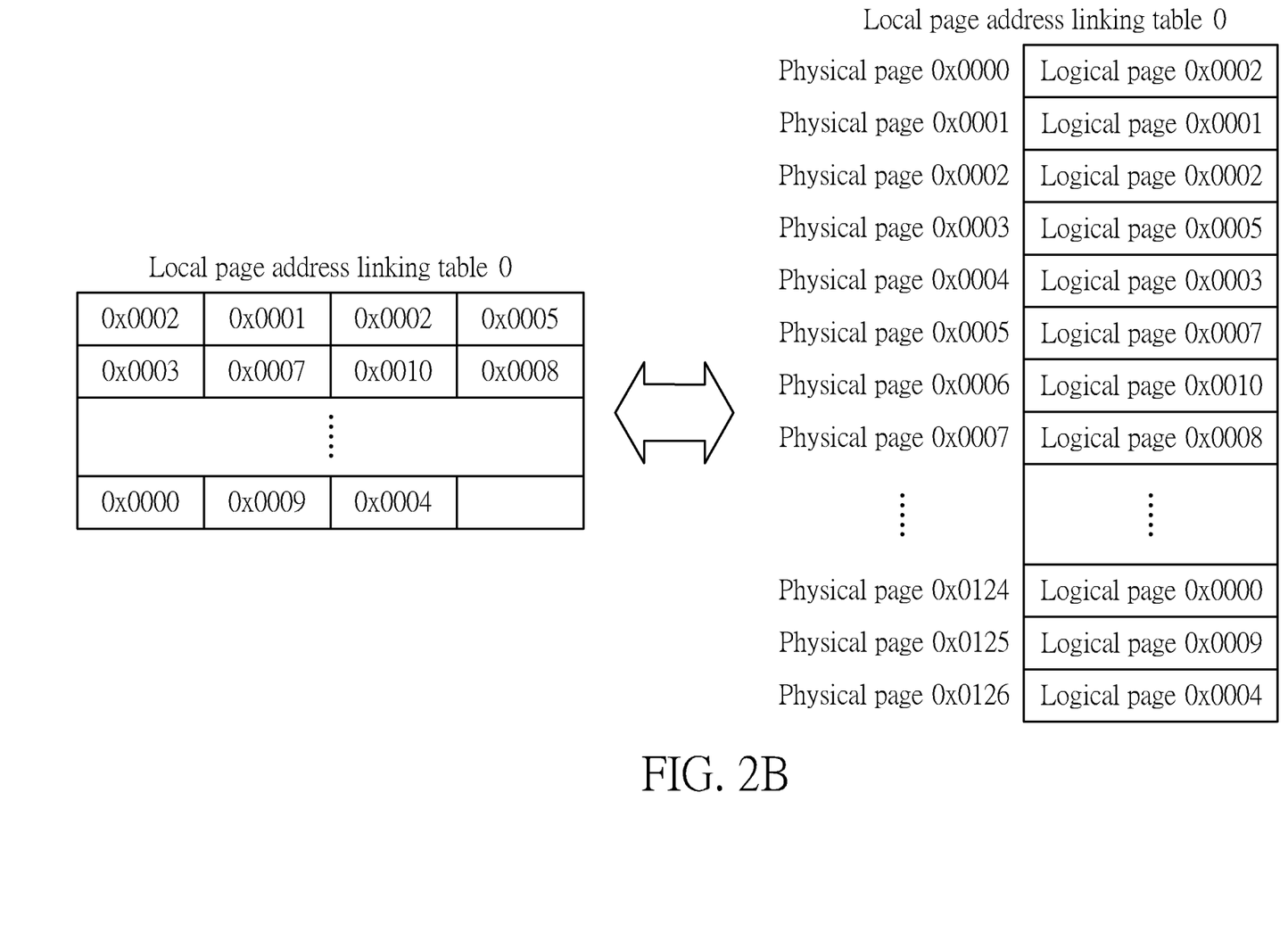
FIG. 2B compares the one-dimensional array illustration and the two-dimensional array illustration of the local page address linking table shown in FIG. 2A.

According to this embodiment, the ranking of a field (or entry) in the temporary/non-temporary local page address linking table (e.g. the temporary local page address linking table 0 or the local page address linking table 0) represents a physical page address, and the content in this field represents an associated logical page address. For example, assume that $i_P$ and $j_P$ represent a row number and column number of the illustrative table location $(i_P, j_P)$ of the temporary/non-temporary local page address linking table shown in FIG. 2A, wherein $i_P$ may be a non-negative integer (e.g. $i_P$=0, 1, . . . ), and $j_P$ may be a non-negative integer (e.g. $j_P$=0, 1, . . . ). In this two-dimensional array illustration of the temporary/non-temporary local page address linking table shown in FIG. 2A, the illustrative table location ($i_P$, $j_P$) corresponding to the ($i_P*4+j_P$)$^{th}$ field represents a physical page address PPN, which may be expressed as follows:

$$PPN=(PBN*DPC+i_P*4+j_P);$$

wherein the parameter PBN represents the physical block number of the above-discussed physical block (e.g. PBN=0, 1, 2, . . . , corresponding to blocks 0, 1, 2, . . . , respectively), and the parameter DPC represents a data page count of each block (e.g. the parameter DPC may be 127 in this embodiment). This is for illustrative purposes, rather than a limitation of the present invention. For better comprehension, the temporary/non-temporary local page address linking table may be depicted as a single column, as shown in the right half of FIG. 2B. Given that $i_P$ is still the row number and $i_P$=0, 1, . . . , in this one-dimensional array illustration shown in the right half of FIG. 2B, for the temporary/non-temporary local page address linking table of the block PBN, the illustrative table location $i_P$ corresponding to the $i_P^{th}$ field represents a physical page address (PBN*DPC+$i_P$). That is, for this one-dimensional array illustration, the above equation may be rewritten as follows:

$$PPN=(PBN*DPC+i_P).$$

When the host device 200 transmits a command to the microprocessor 112 in order to write some data at a logical page address 0x0002, the microprocessor 112 may write the data and the logical page address 0x0002 into the data byte region DBR and the spare byte region SBR of page 0 of block 0 of flash chip 0, respectively, and may write the logical page address 0x0002 into the first field of the temporary local page address linking table 0 in order to indicate that the logical page address 0x0002 is linked/mapped to page 0 of block 0 of flash chip 0, wherein the physical page address thereof is 0x0000. The rest may be deduced by analogy. When all data pages in block 0 have been written, the microprocessor 112 may copy the latest version of the temporary local page address linking table 0 in order to create the local page address linking table 0. Note that logical page addresses {0x0002, 0x0001, 0x0002, 0x0005, 0x0003, 0x0007, 0x0010, 0x0008, . . . , 0x0000, 0x0009, 0x0004} may be taken as an example of the logical addresses. According to some embodiments, the logical addresses may vary.

According to some embodiments, the range of the logical page addresses in a local page address linking table (e.g. the local page address linking table 0) may exceed the number of pages in a block (e.g. the block 0).

According to some embodiments, the microprocessor 112 may create a global page address linking table in the random access memory according to a plurality of local page address linking tables respectively corresponding to a plurality of blocks, in order to record/update the relationships between the physical addresses and the logical addresses.

III. Performance Control

The memory controller 110 may manage programming operations in the memory device 100, in order to solve problems in the related arts without introducing side effects or in a way that is less likely to introduce side effects. For example, the memory controller 110 may dynamically adjust the scheduling of the programming operations for achieving optimal performance of the memory device 100.

Figure 3:
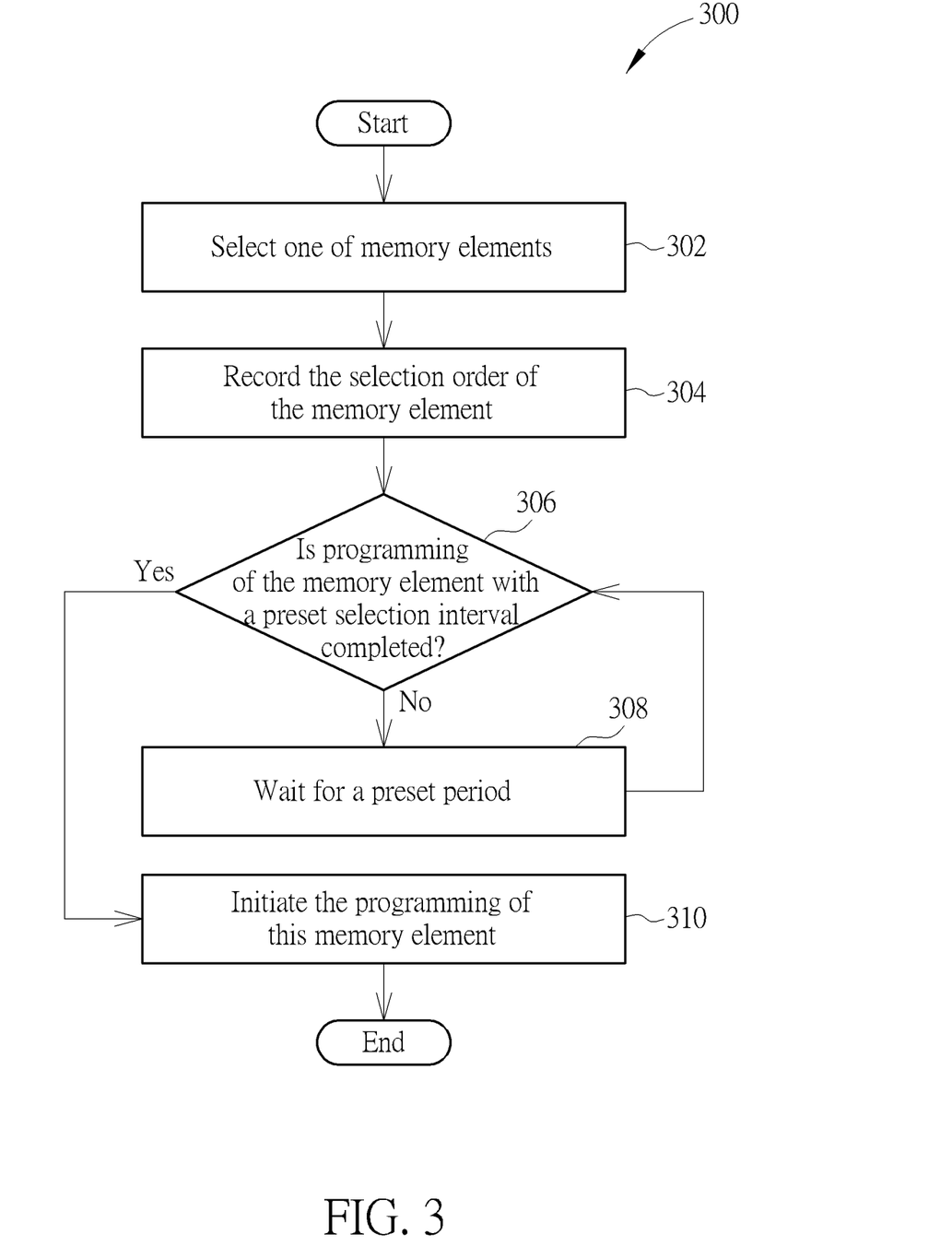
FIG. 3 is a flowchart illustrating a method for performing programming management in a memory device according to an embodiment of the present invention.

FIG. 3 is a flowchart illustrating a method 300 for performing programming management in a memory device according to an embodiment of the present invention, wherein the method 300 is applicable to the memory device 100, and is applicable to the above-mentioned controller such as the memory controller 110. Under the control of the above-mentioned processing circuit such as the microprocessor 112, the memory controller 110 may perform the method 300. For brevity, assume that the memory device 100 may include a single channel, the total number of NV memory elements in the single channel may equal 4 (N=4), and these NV memory elements such as the NV memory elements 122-1, 122-2, 122-3 and 122-4 can be taken as an example in the embodiment. The present invention is not limited thereto, however. The method 300 is also applicable to the memory device 100 with N NV memory elements, wherein N is a positive integer and N=(NPC*NCH), wherein the parameter NCH represents the total channel count, and the parameter NPC represents the NV-memory-element-count per channel.

In Step 302, the memory controller 110 may select one of any un-programmed memory elements. For example, assuming the NV memory elements 122-1, 122-2 and 122-3 have been selected, and these selections have not been canceled, the NV memory element 122-4 is the only one left to be selected. Hence, in Step 302, the memory controller 110 may select the NV memory element 122-4.

In Step 304, the memory controller 110 may record the selection order of the memory element. Assume that NV memory elements 122-1, 122-2 and 122-3 have been selected, and the corresponding selection order is 0, 1 and 2, respectively. In this case, the selection order of the NV memory element 122-4 will be 3.

In Step 306, according to the selection order, the memory controller 110 may determine whether programming of the memory element with a preset selection interval has been completed. If yes, Step 310 is entered; otherwise, Step 308 is entered. The preset selection interval is used to determine the relevance between the previously selected NV memory element and the currently selected NV memory element, and the value of the preset selection interval is smaller than the total number of NV memory elements. According to the selection order, the selection intervals of the NV memory elements 122-1, 122-2 and 122-3 with respect to the NV memory element 122-4 are 3 (e.g. (3−0)=3), 2 (e.g. (3−1)=2) and 1 (e.g. (3−2)=1), respectively. When the preset selection interval is 3, the memory element of the preset selection interval will correspond to the NV memory element 122-1. Then, the memory controller 110 may check whether the NV memory element 122-1 is in a busy state or in a non-busy state. According to this embodiment, the non-busy state may be a ready state, but the present invention is not limited thereto.

In Step 308, the memory controller 110 may wait for a preset period. Afterwards, Step 306 is entered. Since the NV memory elements 122-1, 122-2 and 122-3 have been selected, programming of the NV memory elements 122-1, 122-2 and 122-3 still continues. In order to prevent the memory device 100 from consuming too much electricity, the memory controller 110 may wait for a preset period, e.g. 50 nanoseconds (ns). Then, Step 306 is entered to determine whether programming of the NV memory element 122-1 has been completed. If yes, programming is performed upon the NV memory element 122-4.

In Step 310, the memory controller 110 may initiate (or start) the programming of this memory element. When programming of the NV memory element 122-1 is completed and the NV memory element 122-1 enters the non-busy state, the memory controller 110 may program the selected NV memory element 122-4. In this way, the method 300 can prevent the selected NV memory element 122-4 from being programmed until the NV memory element 122-1 enters the non-busy state (e.g. programming the selected NV memory element 122-4 can be performed when the NV memory element 122-1 enters the non-busy state), thus reaching at least one objective of the present invention. After that, operations of the method 300 end.

Step 310 may further comprise deleting the selection order of this memory element. When the method 300 is executed again, since the respective selection orders of the memory elements whose programming have been completed are deleted, the NV memory elements corresponding to the remaining selection orders are still being programmed and are in the busy state. Hence, the determination result in Step 306 conforms to the actual situations of the NV memory elements 122-1, 122-2, 122-3 and 122-4.

In the above-mentioned embodiment, both the selection order and the programming order of the NV memory elements 122-1, 122-2, 122-3 and 122-4 are shuffled; this explains why Step 304 might be necessary. In another implementation, the selection order of the NV memory elements 122-1, 122-2, 122-3 and 122-4 is fixed. In this situation, Step 304 is not necessary and can be skipped.

In the above-mentioned embodiment, the preset programming interval is preferably equal to the total number of NV memory elements minus one, but the present invention is not limited thereto. For example, the preset programming interval may be an integer which is smaller than the total number of NV memory elements.

Figure 4:
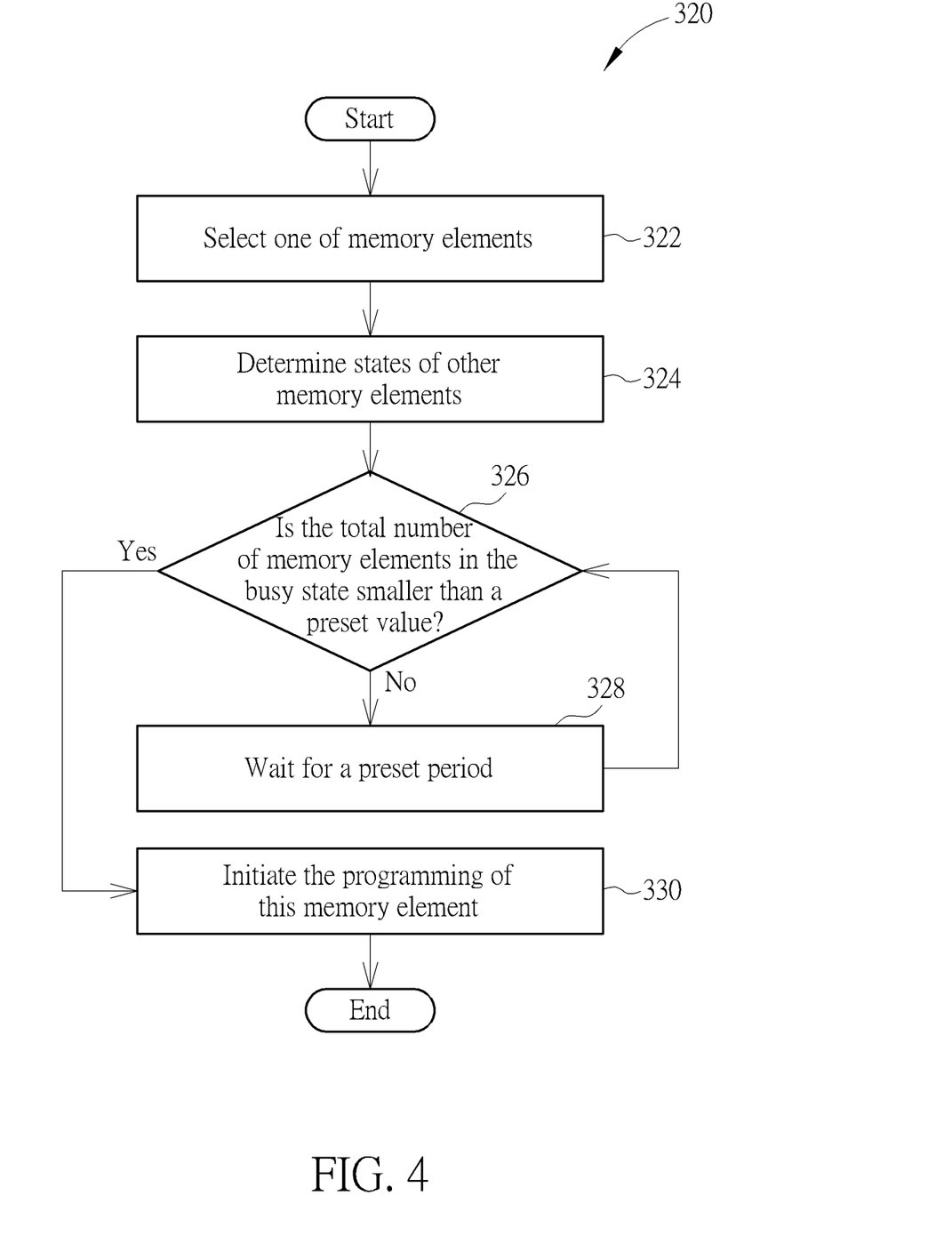
FIG. 4 is a flowchart illustrating a method for performing programming management in a memory device according to another embodiment of the present invention.

FIG. 4 is a flowchart illustrating a method 320 for performing programming management in a memory device according to another embodiment of the present invention, wherein Steps 322, 328 and 330 are the same as Steps 302, 308 and 310, respectively, while Steps 324 and 326 are different from Steps 304 and 306, respectively.

In Step 324, the memory controller 110 may determine states of other memory elements. For example, when the NV memory elements 122-1, 122-2 and 122-3 are selected and being programmed, the states of the NV memory elements 122-1, 122-2 and 122-3 will be busy states.

In Step 326, the memory controller 110 may determine whether the total number of memory elements in the busy state is smaller than a preset value. If yes, Step 330 is entered; otherwise, Step 328 is entered. Assuming that the preset value is 3, since the states of the NV memory elements 122-1, 122-2 and 122-3 are all busy states, the total number of memory elements in the busy state is not smaller than 3, and Step 328 is therefore entered. When the state of one of the NV memory elements 122-1, 122-2 and 122-3 changes from the busy state into the non-busy state (e.g. programming of the NV memory element 122-1 is completed first and the NV memory element 122-1 enters the non-busy state from the busy state), the total number of memory elements in the busy state will be smaller than the preset value and Step 330 will be entered, in order to perform programming on the NV memory element 122-4.

According to some embodiments, before programming a target NV memory element 122-*n* of the NV memory elements 122-1, 122-2, ... and 122-N (the symbol "n" may represent any positive integer within the interval [1, N]), the memory controller 110 may check whether another NV memory element of the NV memory elements 122-1, 122-2, ... and 122-N is in the busy state or in the non-busy state. The non-busy state may be the abovementioned ready state, but the present invention is not limited thereto. When the other NV memory element enters the non-busy state, the memory controller 110 may program the target NV memory element 122-*n*. For example, the memory controller 110 may prevent programming the target NV memory element 122-*n* until the other NV memory element enters the non-busy state. In a predetermined logic sequence of the NV memory elements 122-1, 122-2, ... and 122-N, the other NV memory element is a subsequent NV memory element of the target NV memory element 122-*n*. For better comprehension, the predetermined logic sequence may be {{122-1, 122-2, ..., 122-N}, {122-1, 122-2, ..., 122-N}, ...} (which is formed by repeating the sequence {122-1, 122-2, ..., 122-N}), but the present invention is not limited thereto. When the target NV memory element 122-*n* represents a certain NV memory element of the predetermined logic sequence {{122-1, 122-2, ..., 122-N}, {122-1, 122-2, ..., 122-N}, ...}, in the predetermined logic sequences {{122-1, 122-2, ..., 122-N}, {122-1, 122-2, ..., 122-N}, ...}, the other NV memory element is located after this NV memory element. For example, in the predetermined logic sequence, the other NV memory element may be the next NV memory element of the target NV memory element 122-*n*, such as the NV memory element 122-(*n*+1) or NV memory element 122-(*n*+1−N), wherein: if n<N, the next NV memory element represents the NV memory element 122-(*n*+1); otherwise (i.e. n=N), the next NV memory element represents the NV memory element 122-(*n*+1−N) (i.e. 122-1, when n=N). In this situation, in the NV memory elements 122-1, 122-2, ... and 122-N, the maximum of the number of NV memory elements that are simultaneously in the busy state may equal the total number of NV memory elements 122-1, 122-2, ... and 122-N minus one. Further, the predetermined logic sequence may indicate a programming order (e.g. the order of programming operations) applicable to the NV memory elements 122-1, 122-2, ... and 122-N. In response to at least one request from outside the memory device 100, the memory controller 110 may take turns programming the NV memory elements 122-1, 122-2, ... and 122-N according to the predetermined logic sequence. The above-mentioned at least one request may represent at least one writing command transmitted from the host device 200 to the memory device 100. In response to the above-mentioned at least one writing command, the memory device 100 may perform a series of programming operations upon the NV memory elements 122-1, 122-2, ... and 122-N, to store a series of data into the NV memory 120 as soon as possible without encountering the problems associated with the related arts, e.g. instantaneous power consumption exceeding the predetermined product specification. Based on the method 200, the memory controller 110 can manage the series of programming operations to achieve optimal performance of the memory device 100 without introducing side effects or in a way that is less likely to introduce side effects.

According to some embodiments, the memory controller 110 may simultaneously program a set of NV memory elements of the NV memory elements 122-1, 122-2, ... and 122-N, and make the amount of the set of NV memory elements be less than or equal to a predetermined NV memory element count, wherein the predetermined NV memory element count is smaller than the total number of the NV memory elements 122-1, 122-2, ... and 122-N. For example, during checking whether the other NV memory element is in the busy state or in the non-busy state, the target NV memory element 122-*n* has not yet been selected as an NV memory element of the set of NV memory elements. When the other NV memory element enters the non-busy state, the memory controller 110 may select the target NV memory element 122-*n* as the NV memory element of the set of NV memory elements. In another example, before checking whether the other NV memory element is in the busy state or in the non-busy state, the other NV memory element has been selected as one of the set of NV memory elements. When the other NV memory element enters the non-busy state, the other NV memory element is not one of the set of NV memory elements.

Figure 5:
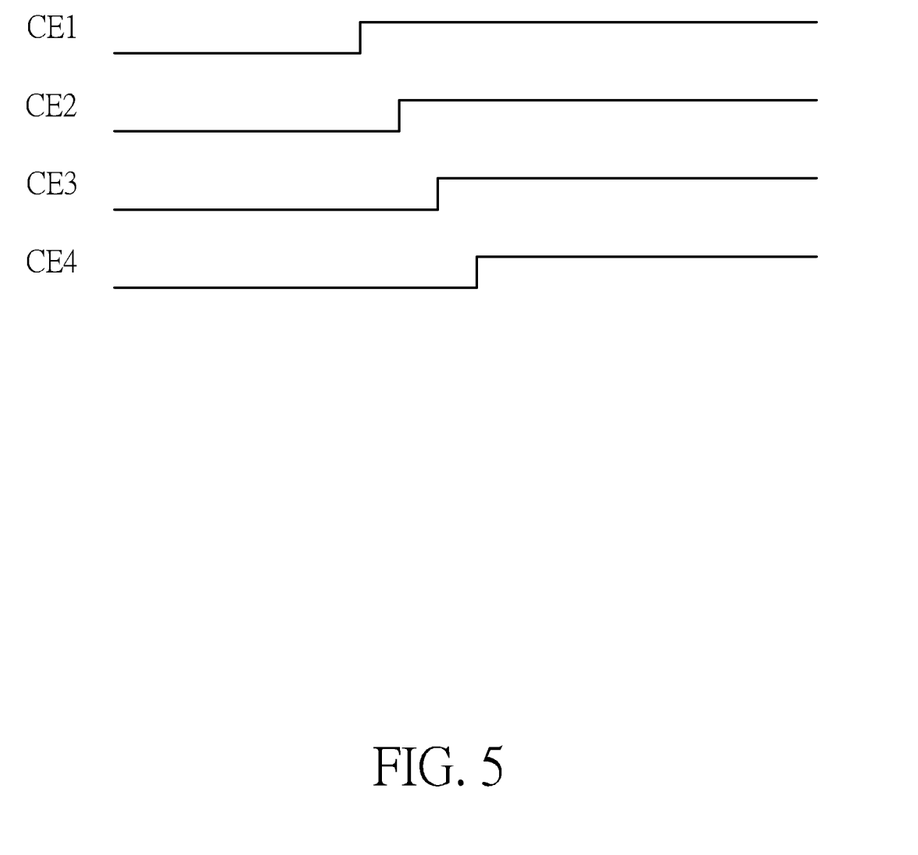
FIG. 5 is a diagram illustrating a chip-enable (CE) control scheme according to an embodiment of the present invention, wherein the chip-enable control scheme is applicable to the methods shown in FIG. 3 and FIG. 4.

FIG. 5 is a diagram illustrating a chip-enable (CE) control scheme according to an embodiment of the present invention, wherein the chip-enable control scheme is applicable to the method 300 shown in FIG. 3 and the method 320 shown in FIG. 4. It is assumed that N=4 in this embodiment, but the present invention is not limited thereto. In this situation, the NV memory elements 122-1, 122-2, ... and 122-N may represent four NV memory elements 122-1, 122-2, 122-3 and 122-4. The memory controller 110 may control the respective states of the chip-enable signals CE1, CE2, CE3, and CE4, to enable or disable the four NV memory elements 122-1, 122-2, 122-3 and 122-4, respectively. For example, when any chip-enable signal of the chip-enable signals CE1, CE2, CE3, and CE4 is in a low voltage level, the NV memory element controlled by this chip-enable signal may be in the busy state. In another example, when any chip-enable signal of the chip-enable signals CE1, CE2, CE3, and CE4 is in a high voltage level, the NV memory element controlled by this chip-enable signal may be in the non-busy state, such as the abovementioned ready state. When there is a need, the memory controller 110 may poll any chip-enable signal of the chip-enable signals CE1, CE2, CE3, and CE4 to realize whether the NV memory element controlled by this chip-enable signal is in the busy state or in the non-busy state. According to this embodiment, the memory controller 110 may control the chip-enable signals CE1, CE2, CE3, and CE4 to simultaneously enter the low voltage level, but the present invention is not limited thereto.

Figure 6:
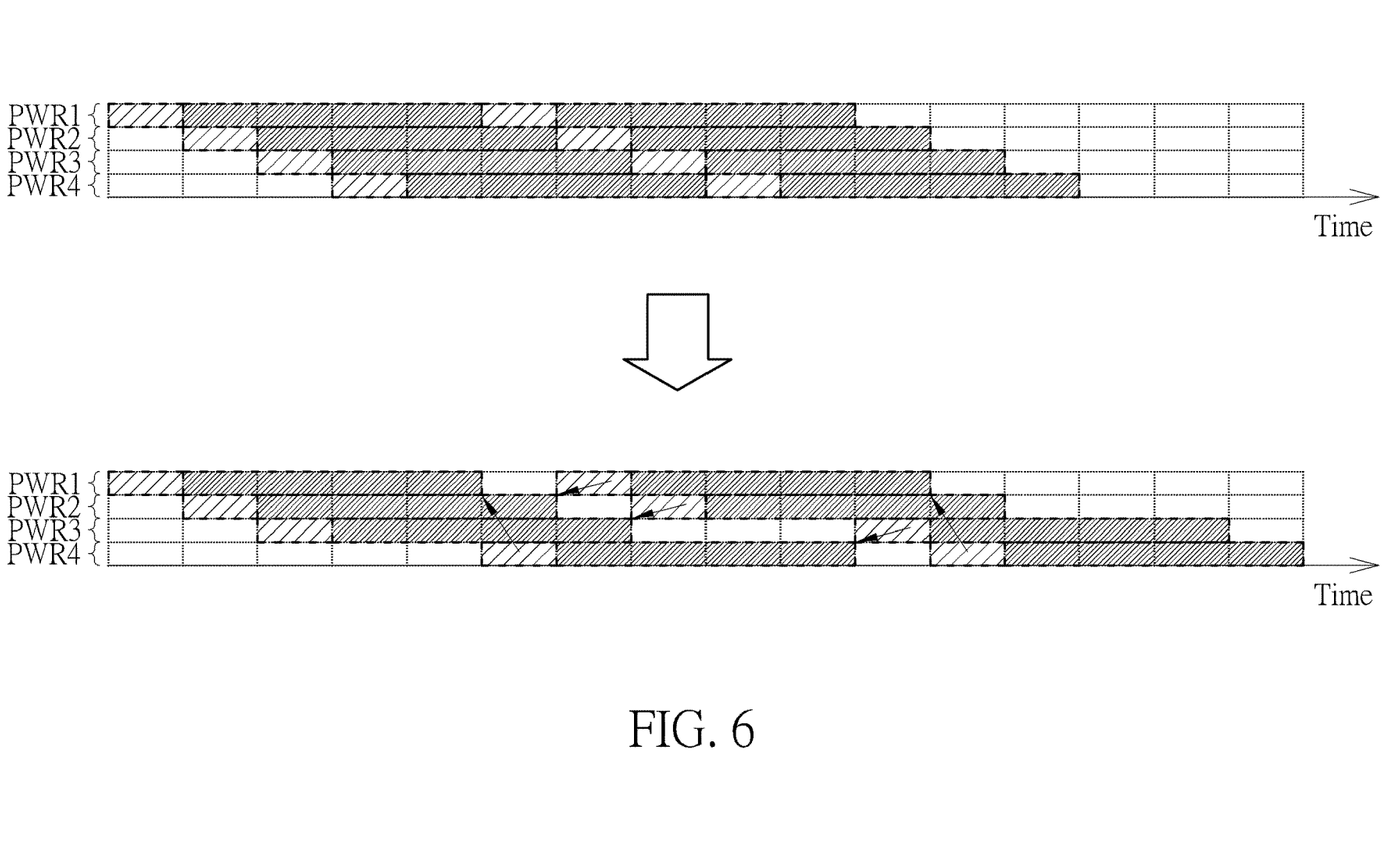
FIG. 6 is a diagram illustrating a power consumption control scheme according to an embodiment of the present invention, wherein the power consumption control scheme is applicable to the methods shown in FIG. 3 and FIG. 4.

FIG. 6 is a diagram illustrating a power consumption control scheme according to an embodiment of the present invention, wherein the power consumption control scheme is applicable to the method 300 shown in FIG. 3 and the method 320 shown in FIG. 4, wherein the horizontal axis shown in FIG. 6 represents time. The respective power consumptions PWR1, PWR2, PWR3, and PWR4 of the NV memory elements 122-1, 122-2, 122-3 and 122-4 may be represented as different shades, respectively, wherein the heavily-shaded regions may represent high power consumption caused by programming operations, the lightly-shaded regions may represent low power consumption caused by non-programming operations, and the non-shaded regions may represent no power consumption or extremely low power consumption. As shown in the upper half of FIG. 6, should simultaneously programming NV memory elements 122-1, 122-2, 122-3 and 122-4 be performed, it might cause the power consumption of the memory device 100 to exceed a predetermined power limitation. As shown in the lower half of FIG. 6, the above problem can be prevented by utilizing the memory controller 110 to perform programming management based on the method 300, wherein the arrow pointing to the tails of some heavily-shaded regions may indicate that the memory controller 110 is able to achieve optimal performance of the memory device 100.

According to this embodiment, the memory controller 110 may control the amount of NV memory elements that are simultaneously in the busy state within the NV memory elements 122-1, 122-2, 122-3 and 122-4. For example, within the NV memory elements 122-1, 122-2, 122-3 and 122-4, the maximum amount of NV memory elements that are simultaneously in the busy state may equal the total number of NV memory elements 122-1, 122-2, 122-3 and 122-4 minus one (i.e. 3), wherein the predetermined logic sequences may be {{122-1, 122-2, 122-3, 122-4}, {122-1, 122-2, 122-3, 122-4}, ... }, but the present invention is not limited thereto. Hence, the memory controller 110 may keep the amount of NV memory elements that are simultaneously in the busy state within the NV memory elements 122-1, 122-2, 122-3 and 122-4 from exceeding the predetermined NV memory element count, in order to control the power consumption of the memory device 100 to stay within the predetermined power limitation.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for performing programming management in a memory device, the memory device comprising a non-volatile (NV) memory, the NV memory comprising a plurality of NV memory elements, and the method comprising:
    selecting a target NV memory element of the plurality of NV memory elements to be programmed;
    determining a serial number of the target NV memory element of the plurality of NV memory elements;
    according to a preset selection interval and the serial number of the target NV memory element, determining a serial number of a specific NV memory element which is a previous NV memory element of the target NV memory element in a predetermined programming sequence of the plurality of NV memory elements; and
    determining whether the specific NV memory element of the plurality of NV memory elements is in a busy state;
    wherein programming of the target NV memory element is only allowed when the specific NV memory element is not in the busy state.

2. The method of claim 1, wherein the plurality of NV memory elements represents a plurality of flash memory dies, respectively.

3. The method of claim 1, wherein in the predetermined logic sequence, the specific NV memory element is an immediately previous NV memory element of the target NV memory element.

4. The method of claim 1, wherein the predetermined logic sequence indicates an order of programming operations applicable to the plurality of NV memory elements; and the method further comprises:
    programming the plurality of NV memory elements in turns according to the predetermined logic sequence in response to at least one request that is transmitted from outside the memory device.

5. The method of claim 1, wherein the preset selection interval indicates a difference between the serial number of the target NV memory element and the serial number of the specific NV memory element according to a selection order of the predetermined programming sequence.

6. The method of claim 5, wherein the preset selection interval will be deleted before selecting a next target NV memory element of the plurality of NV memory elements to be programmed.

7. A memory device, comprising:
    a non-volatile (NV) memory, arranged to store information, wherein the NV memory comprises a plurality of NV memory elements; and a controller, coupled to the NV memory, the controller arranged to control operations of the memory device, wherein the controller comprises:

a processing circuit, arranged to control the controller according to a command from a host device, to allow the host device to access the NV memory via the controller, wherein:

the controller selects a target NV memory element of the plurality of NV memory elements to be programmed determines a serial number of the target NV memory element of the plurality of NV memory elements, determines a serial number of a specific NV memory element which is a previous NV memory element of the target NV memory element in a predetermined programming sequence of the plurality of NV memory elements according to a preset selection interval and the serial number of the target NV memory element, and determines whether the specific NV memory element of the plurality of NV memory elements is in a busy state, wherein programming of the target NV memory element is only allowed when the specific NV memory element is not in the busy state.

8. The memory device of claim 7, wherein the plurality of NV memory elements represents a plurality of flash memory dies, respectively.

9. The memory device of claim 7, wherein in the predetermined logic sequence, the specific NV memory element is an immediately previous NV memory element of the target NV memory element.

10. A controller of a memory device, the memory device comprises the controller and a non-volatile (NV) memory, the NV memory comprises a plurality of NV memory elements, the controller comprising:

a processing circuit, arranged to control the controller according to a command from a host device, to allow the host device to access the NV memory via the controller, wherein:

the controller selects a target NV memory element of the plurality of NV memory elements to be programmed determines a serial number of the target NV memory element of the plurality of NV memory elements, determines a serial number of a specific NV memory element which is a previous NV memory element of the target NV memory element in a predetermined programming sequence of the plurality of NV memory elements according to a preset selection interval and the serial number of the target NV memory element, and determines whether the specific NV memory element of the plurality of NV memory elements is in a busy state, wherein programming of the target NV memory element is only allowed when the specific NV memory element is not in the busy state.

11. The controller of claim 10, wherein the plurality of NV memory elements represents a plurality of flash memory dies, respectively.

12. The controller of claim 10, wherein in the predetermined logic sequence, the specific NV memory element is an immediately previous NV memory element of the target NV memory element.

* * * * *